United States Patent
Barber et al.

(10) Patent No.: US 10,503,586 B2
(45) Date of Patent: Dec. 10, 2019

(54) DYNAMIC READ BASED ON READ STATISTICS

(71) Applicant: SanDisk Technologies LLC, Plano, TX (US)

(72) Inventors: Edgar Barber, Ness Ziona (IL); Alex Bazarsky, Holon (IL); Ariel Navon, Revava (IL); Gadi Vishne, Petach-Tikva (IL); Joshua Lehmann, Modin (IL); Judah Gamliel Hahn, Ofra (IL)

(73) Assignee: SANDISK TECHNOLOGIES LLC, Addison, TX (US)

( * ) Notice: Subject to any disclaimer, the term of this patent is extended or adjusted under 35 U.S.C. 154(b) by 88 days.

(21) Appl. No.: 15/497,220

(22) Filed: Apr. 26, 2017

(65) Prior Publication Data
US 2018/0314587 A1    Nov. 1, 2018

(51) Int. Cl.
| | |
|---|---|
| G06F 11/10 | (2006.01) |
| G06F 3/06 | (2006.01) |
| G11C 11/56 | (2006.01) |
| G11C 16/34 | (2006.01) |
| G11C 29/02 | (2006.01) |
| G11C 29/44 | (2006.01) |
| G11C 29/52 | (2006.01) |

(52) U.S. Cl.
CPC ........ *G06F 11/1016* (2013.01); *G06F 3/0604* (2013.01); *G06F 3/0647* (2013.01); *G06F 3/0659* (2013.01); *G06F 3/0688* (2013.01); *G11C 11/5642* (2013.01); *G11C 16/349* (2013.01); *G11C 29/021* (2013.01); *G11C 29/028* (2013.01); *G11C 29/44* (2013.01); *G11C 29/52* (2013.01)

(58) Field of Classification Search
CPC .. G06F 11/1016; G06F 3/0604; G06F 3/0647; G06F 3/0659; G06F 3/0688
See application file for complete search history.

(56) References Cited

U.S. PATENT DOCUMENTS

| | | | |
|---|---|---|---|
| 8,315,092 B2 | 11/2012 | Strasser et al. | |
| 8,839,073 B2 | 9/2014 | Cohen | |
| 2011/0182119 A1 | 7/2011 | Strasser et al. | |
| 2013/0343131 A1* | 12/2013 | Wu .................. | G11C 16/26 365/185.24 |

(Continued)

FOREIGN PATENT DOCUMENTS

WO    2011094454 A2    8/2011

OTHER PUBLICATIONS

PCT Application PCT/US18/23896 Partial Search Report dated Jun. 8, 2018.

(Continued)

*Primary Examiner* — Kyle Vallecillo
(74) *Attorney, Agent, or Firm* — Vierra Magen Marcus LLP

(57) ABSTRACT

Apparatuses, systems, and methods are disclosed for dynamic read operations. An on-die controller monitors one or more read statistics during a read operation for data of a non-volatile memory die. An on-die controller determines whether one or more read statistics satisfy a threshold for a read operation. An on-die controller dynamically modifies a read operation based on determining that one or more read statistics fail to satisfy a threshold.

17 Claims, 9 Drawing Sheets

(56) References Cited

U.S. PATENT DOCUMENTS

| | | | |
|---|---|---|---|
| 2014/0068365 A1 | 3/2014 | Chen et al. | |
| 2014/0229131 A1* | 8/2014 | Cohen | G11C 16/0483 |
| | | | 702/64 |
| 2014/0281119 A1* | 9/2014 | Hyun | G06F 12/0238 |
| | | | 711/102 |
| 2015/0127883 A1* | 5/2015 | Chen | G11C 11/5642 |
| | | | 711/103 |
| 2015/0205664 A1* | 7/2015 | Janik | G06F 11/1012 |
| | | | 714/764 |
| 2016/0141044 A1 | 5/2016 | Sun et al. | |
| 2017/0255399 A1* | 9/2017 | Yang | G06F 3/0616 |

OTHER PUBLICATIONS

PCT Application PCT/US18/23896 ISR and Written Opinion dated Aug. 1, 2018.

* cited by examiner

US 10,503,586 B2

DYNAMIC READ BASED ON READ STATISTICS

TECHNICAL FIELD

The present disclosure, in various embodiments, relates to reading data from non-volatile memory and more particularly relates to dynamic read operations based on read statistics.

BACKGROUND

A non-volatile memory device controller or driver may encode or transform data to be written to a non-volatile medium. Data may be encoded or transformed in a variety of ways, such as by compressing the data, encrypting the data, scrambling or whitening the data (so that an approximately equal number of binary zeros and ones are stored), applying an error correcting code to the data, or the like.

When a read operation is performed for the non-volatile medium, errors may be present in the data. Errors may arise due to various phenomena that affect the stored data, such as charge leakage, disturbances from programming or erasing data in nearby regions of the non-volatile medium, temperature effects, or the like. Errors may also occur as data is moved during read, write, or garbage collection operations.

When the driver or controller decodes the data, or reverses the data transformation, errors may increase the amount of time or power used by the decoder. For example, if a parity check fails for an error correcting code, it may take further time and power to detect and correct the errors before the decoded data can be retrieved. A high error rate may also prevent the decoder from decoding the data, or reversing the data transformation. For example, a decoder for an error-correcting code may fail, and issue an error message indicating that an uncorrectable error has occurred.

SUMMARY

Apparatuses are presented for dynamic read operations. In one embodiment, an apparatus includes an on-die controller for a non-volatile memory die. In a certain embodiment, an on-die controller is configured to monitor one or more read statistics during a read operation for data of a non-volatile memory die. In a further embodiment, an on-die controller is configured to determine whether one or more read statistics satisfy a threshold for a read operation. In certain embodiments, an on-die controller is configured to dynamically modify a read operation based on determining that one or more read statistics fail to satisfy a threshold.

Methods are presented for dynamic read operations. In one embodiment, a method includes initiating a read operation for data of a non-volatile memory element. In a further embodiment, data may be stored subject to a data transformation that balances bit values for the data. In a certain embodiment, a method includes tracking an ongoing balance between bit values for data during a read operation. In a further embodiment, a method includes dynamically adjusting a read operation based on a tracked ongoing balance between bit values.

An apparatus, in another embodiment, includes means for monitoring one or more read statistics during a read operation for data of a non-volatile memory die. In a certain embodiment, an apparatus includes means for comparing one or more read statistics to one or more expected statistics for data. In a further embodiment, an apparatus includes means for dynamically updating a read operation based on a variance between one or more read statistics and one or more expected statistics for data.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
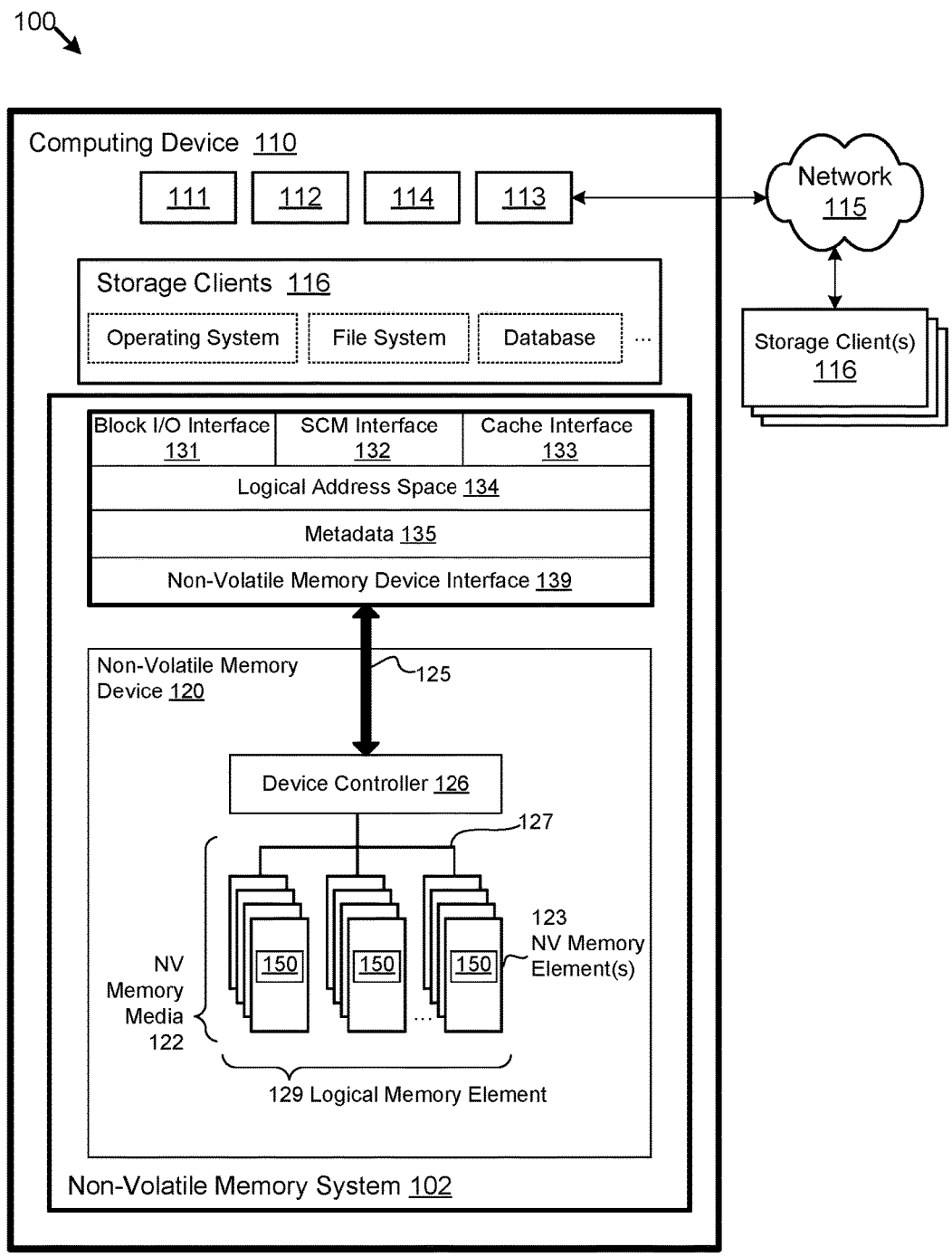
FIG. 1 is a schematic block diagram of one embodiment of a system comprising a dynamic read component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more dynamic read components 150 for a non-volatile memory device 120. A dynamic read component 150 may be part of a non-volatile memory element 123, and may be in communication with a device controller 126 external to the non-volatile memory elements 123, a device driver, or the like. The dynamic read component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the dynamic read component 150 may include one or more computer readable instructions stored on the non-transitory storage medium 114.

The non-volatile memory system 102, in the depicted embodiment, includes one or more dynamic read components 150. A dynamic read component 150, in one embodiment, is configured to monitor one or more read statistics during a read operation for data of a non-volatile memory element 123 or die, determine whether the one or more read statistics satisfy a threshold for the read operation, and dynamically modify the read operation based on determining that the one or more read statistics fail to satisfy the threshold.

In various embodiments, monitoring read statistics may allow a dynamic read component 150 to modify, adjust, or update a read operation to avoid or respond to errors, or error-causing phenomena. In certain embodiments, a device controller 126 external to the non-volatile memory elements 123 for a non-volatile memory device 120 may detect and respond to errors after a non-volatile memory element 123 has completed a read operation and transferred the data from the read operation to the device controller 126. By contrast, dynamically modifying a read operation using dynamic read components 150 at the level of the individual non-volatile memory elements 123 may reduce the amount of erroneous data sent over a shared bus 127, conserve time and power for an error-correcting code (ECC) decoder, facilitate parallel read operations for different non-volatile memory elements 123, and/or the like.

In one embodiment, a dynamic read component 150 may comprise logic hardware of a non-volatile memory element 123, other programmable logic, firmware for a for a non-volatile memory element 123, microcode for execution by a non-volatile memory element 123, or the like. In another embodiment, a dynamic read component 150 may comprise executable software code, stored on a computer readable storage medium for execution by logic hardware of a non-volatile memory element 123. In a further embodiment, a dynamic read component 150 may include a combination of both executable software code and logic hardware.

In one embodiment, the dynamic read component 150 is configured to receive storage requests from a device driver or other executable application via buses 125, 127, a device controller 126, or the like. The dynamic read component 150 may be further configured to transfer data to/from a device driver and/or storage clients 116 via the bus 125. Accordingly, the dynamic read component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the dynamic read component 150 may receive storage requests as an API call from a storage client 116, as an IO-CTL command, or the like. The dynamic read component 150 is described in further detail below with regard to FIG. 5 and FIG. 6.

According to various embodiments, a device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A device controller 126, external to the one or more non-volatile memory elements 123, may be configured to manage data operations on the non-volatile memory media 122, and may comprise one or more processors, programmable processors (e.g., FPGAs), ASICs, microcontrollers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the device controller 126 over a bus 125, as described above.

Figure 2:
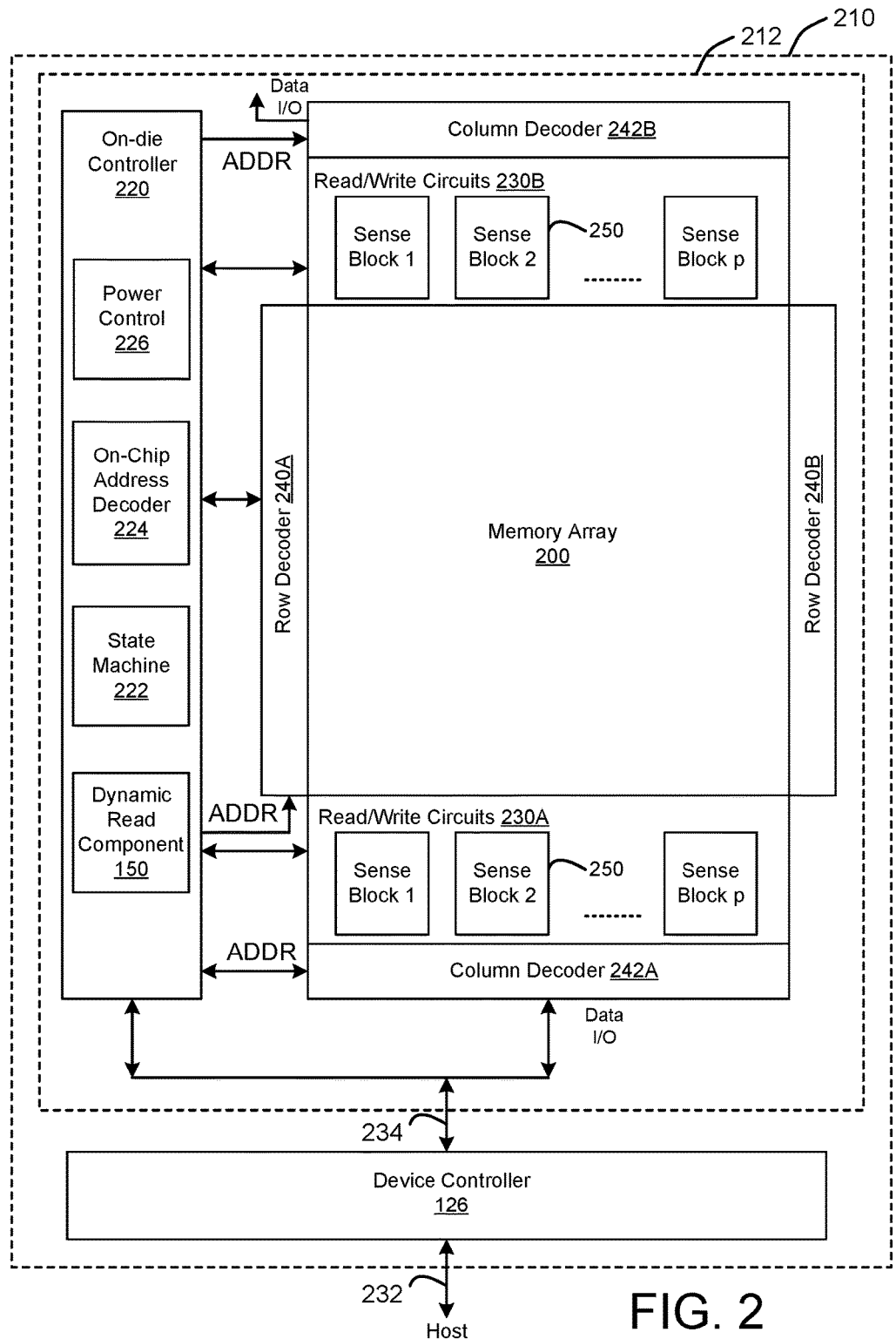
FIG. 2 is a schematic block diagram illustrating another embodiment of a system comprising a dynamic read component.

FIG. 2 illustrates an embodiment of a non-volatile storage device 210 that may include one or more memory die or chips 212. The nonvolatile storage device 210 may be substantially similar to the nonvolatile memory device 120 described with reference to FIG. 1. Memory die 212, in some embodiments, includes an array (two-dimensional or three dimensional) of memory cells 200, on-die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a device controller 126 external to the memory die 212 is included in the same memory device 210 (e.g., a removable storage card or package) as the one or more memory die 212. Commands and data are transferred between the host and the device controller 126 via lines 232 and between the device controller 126 and the one or more memory die 212 via lines 234. One implementation can include multiple chips 212.

On-die controller 220, in one embodiment, cooperates with the read/write circuits 230A/230B to perform memory operations on the memory array 200. The on-die controller 220, in certain embodiments, includes a dynamic read component 150, a state machine 222, an on-chip address decoder 224, and a power control circuit 226. The dynamic read component 150, in one embodiment, is configured to monitor one or more read statistics during a read operation for data of the memory array 200, determine whether the one or more read statistics satisfy a threshold for the read operation, and dynamically modify the read operation based on determining that the one or more read statistics fail to satisfy the threshold.

The state machine 222, in one embodiment, provides chip-level control of memory operations. The on-chip address decoder 224 provides an address interface to convert between the address that is used by the host or a device controller 126 to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In certain embodiments, the state machine 222 includes an embodiment of the dynamic read component 150. The dynamic read component 150, in certain embodiments, may include software, firmware, or hardware in an on-die controller 220 and/or a state machine 222.

In one embodiment, one or any combination of on-die controller 220, dynamic read component 150, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or device controller 126 can be referred to as one or more managing circuits.

FIGS. 3A, 3B, 3C, and 3D are graphs 300, 320, 340, 360 depicting distributions of threshold voltages for storage cells of a non-volatile memory element 123. In the depicted embodiment, the graphs 300, 320, 340, 360 illustrate a plurality of read thresholds 302, 322, 342, 362 that divide a range of possible threshold voltages for the cells into states L0, L1, L2, L3.

As used herein, a "cell" refers to the smallest physical unit of storage or memory in a non-volatile memory element 123. In some embodiments, each cell has a physical and/or electrical property which may be altered to encode or otherwise store data. For example, in flash memory, a cell may include a floating gate transistor, and the physical property used to encode data may be the charge stored on the floating gate, a stored read voltage level caused by the charge stored on the floating gate, the threshold voltage $V_t$ that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. Various types of storage cells for various types of non-volatile memory will be clear in view of this disclosure.

In the depicted embodiment, the storage cells are flash memory cells (e.g., floating gate transistors), and the data-encoding physical property is the threshold voltage $V_t$. The depiction of distributions, read thresholds 302, 322, 342, 362 and states L0, L1, L2, L3 in relation to a threshold voltage $V_t$ is for illustrative and non-limiting purposes; the disclosure may be similarly applicable to read thresholds and states for another data-encoding physical property, for another type of non-volatile memory. The threshold voltage $V_t$ is shown on the horizontal axis of each of the graphs 300, 320, 340, 360, and the vertical axis illustrates a number of cells, so that the graphs 300, 320, 340, 360 show the numbers of cells at various threshold voltages $V_t$.

In the depicted embodiment, read thresholds 302, 322, 342, 362, divide a range of possible values for the threshold voltage $V_t$ into states L0, L1, L2, L3. In the depicted embodiment, multi-level cell (MLC) flash memory cells use four states L0, L1, L2, L3 to store two bits per cell. However, in another embodiment, a range of possible values for a threshold voltage $V_t$ (or other data-encoding physical property) may be divided into more or fewer states, to store more or fewer bits per cell. In one embodiment, an encoding maps states onto data values. For example, in the depicted embodiment, a Gray code encoding maps the four states L0, L1, L2, and L3 to the data values "11," "01," "00," and "10," respectively. In another embodiment, another encoding may map states to data values in another way.

Figure 3A:
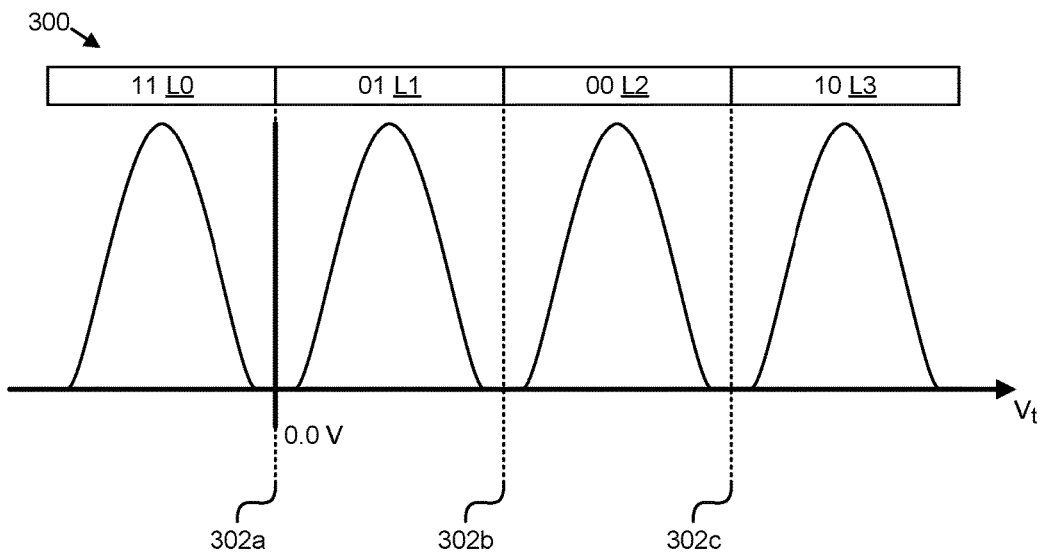
FIG. 3A is a graph illustrating one embodiment of a distribution of threshold voltages for cells of a non-volatile memory element.

In FIG. 3A, the graph 300 depicts an initial distribution of threshold voltages $V_t$ when data is written to cells of a non-volatile memory element 123. In the depicted embodiment, the distribution forms a bell-shaped peak in each state. In some embodiments, a cell may be programmed to a state by issuing voltage pulses that move the threshold voltage $V_t$ for the cell to or near a target voltage for that state. Thus, a bell-shaped peak may be centered on the target programming voltage, or the like. The width of the peaks may be affected by variations in the cells and the programming process, or by error-causing phenomena such as read disturbs, program disturbs, stress-induced leakage current, or the like. Although symmetric, bell-shaped peaks are shown, skewed distributions and other distributions are possible. Over time, the distributions may widen or skew as the threshold voltages $V_t$ of cells move from their originally programmed values.

Additionally, graph 300 depicts a substantially uniform distribution among states L0-L3 (e.g., there are approximately the same number of cells in each state L0-L3). In certain embodiments, a known balance among states (e.g., a uniform or known distribution among states) may result from encoding or transforming data with a known balance between ones and zeros. For example, if data is transformed according to a scrambling or whitening transformation so that an approximately equal number of binary zeros and ones are stored, then writing data to the cells may also result in an approximately equal number of cells in each state. In another embodiment, data may be written with another known balance between ones and zeros, or between states.

In one embodiment, a read operation may include sensing whether the data-encoding physical property of a cell (e.g., the threshold voltage $V_t$) is above or below a read threshold 302. For example, a read voltage may be applied to the control gate of a floating gate transistor storage cell at the level of the first read threshold 302a. If the cell turns on (e.g., conducts between source and drain terminals), then the threshold voltage $V_t$ for the storage cell is lower than first read threshold 302a, and the cell is in the L0 state. If the cell does not turn on when the first read voltage is applied, but turns on when a read voltage is applied at the level of the second read threshold 302b, then the cell is in the L1 state, and so on. In another embodiment, a ramping voltage (e.g., a voltage signal that increases linearly from 0 V to 12 V, or the like) may be applied to the control gate, and sense amplifiers may determine when (or at what voltage) the cell turns on.

In FIG. 3A, the graph 300 depicts narrow and well-separated peaks, centered in states L0, L1, L2, and L3. As depicted, an initial distribution of threshold voltages $V_t$ when data is written may include narrow peaks, due to cells being close to a target programming voltage. Thus, a read operation using read thresholds 302a, 302b, and 302c should retrieve the data as written, with few errors. However, the peaks may widen over time, as the threshold voltage $V_t$ for individual cells may drift in either direction due to phenomena such as program disturbs, read disturbs, temperature effects, or the like. Additionally, the peaks may also shift towards lower voltages over time, as the threshold voltage $V_t$ for individual cells may drift lower due to charge leakage.

Figure 3B:
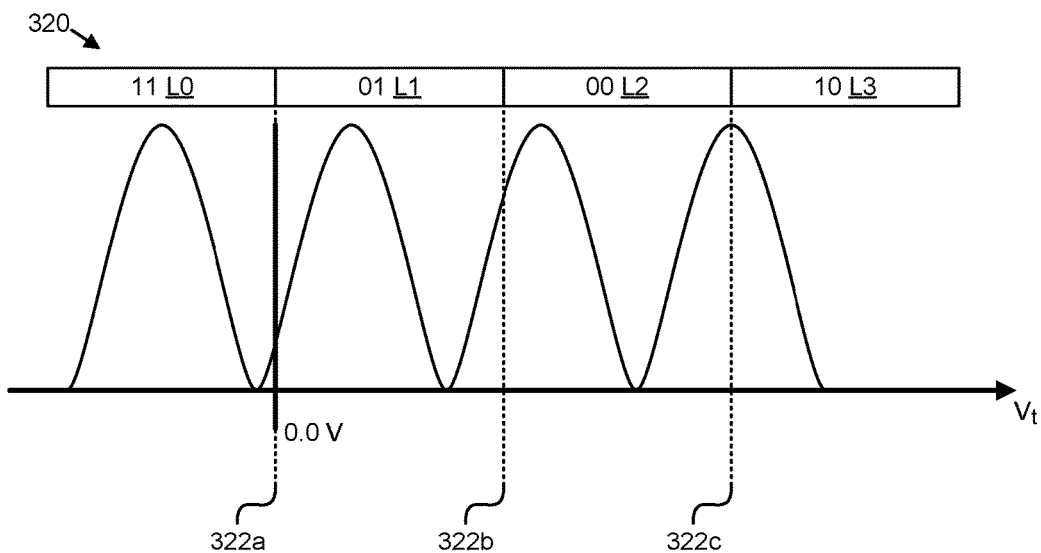
FIG. 3B is a graph illustrating another embodiment of a distribution of threshold voltages for cells of a non-volatile memory element.

In FIG. 3B, the graph 320 depicts a distribution of threshold voltages $V_t$ for the same cells as FIG. 3A, at a later time. The peaks in graph 320 have shifted lower due to charge leakage. However, the read thresholds 322 that define the boundaries between states L0-L3 are at the same voltages as the read thresholds in FIG. 3A. Thus, a read operation will return data with errors, as some of the cells that were programmed to the L3 state will now be sensed in the L2 state, some of the cells that were programmed to the L2 state will now be sensed in the L1 state, and so on.

In a certain embodiment, a dynamic read component 150 may monitor one or more read statistics, such as a count or proportion of ones, a count or proportion of zeros, a ratio between ones and zeros, a count or proportion of cells for any of the states L0-L3, a ratio of cells in different states, or the like, during a read operation. In further embodiments, certain read statistics may correspond to shifting or widening peaks. For example, in the depicted embodiment, the number of cells in state L0 is greater than when the data was written (as depicted in graph 300 of FIG. 3A), and the number of cells in state L3 is less than when the data was written, due to threshold voltages $V_t$ for the cells drifting in a negative direction, past the established read thresholds 322. Thus, monitoring the number of cells in state L0 or L3 may suggest that the peaks have shifted as shown in graph 320.

In a certain embodiment, the dynamic read component 150 may determine whether the one or more read statistics satisfy a threshold. A threshold for a read statistic may be a value to which the read statistic is compared, to determine whether the read statistic is within an expected, allowed, or acceptable range (e.g., satisfies the threshold), or is outside of an expected, allowed, or acceptable range (e.g., fails to satisfy the threshold). In certain embodiments, a threshold for a read statistic may be selected or set by a manufacturer of a non-volatile storage element 123, a user or administrator of a non-volatile memory device 120, or the like, based on an expected or desired range for the read statistic. For example, in one embodiment, if data is read from groups of 512 cells at a time, and if data is stored subject to a scrambling or whitening transformation, then 128 cells (e.g., one quarter of the cells for the read operation) may be expected to be in state L0. A small variation in the number of cells in the L0 state may be attributable to randomness in the scrambling or whitening transformation. However, a larger imbalance in the number of cells in the L0 state may suggest that the peaks have shifted as shown in FIG. 3B. Thus, if the read statistic(s) monitored by the dynamic read component 150 during a read operation include the number of cells in the L0 state, and a threshold for that read statistic is established at slightly more than a quarter of the number of cells read during a read operation, than the statistic failing to satisfy the threshold may indicate that the peaks have shifted, and that errors are likely. Accordingly, in certain embodiments, a dynamic read component 150 may dynamically modify a read operation.

Figure 3C:
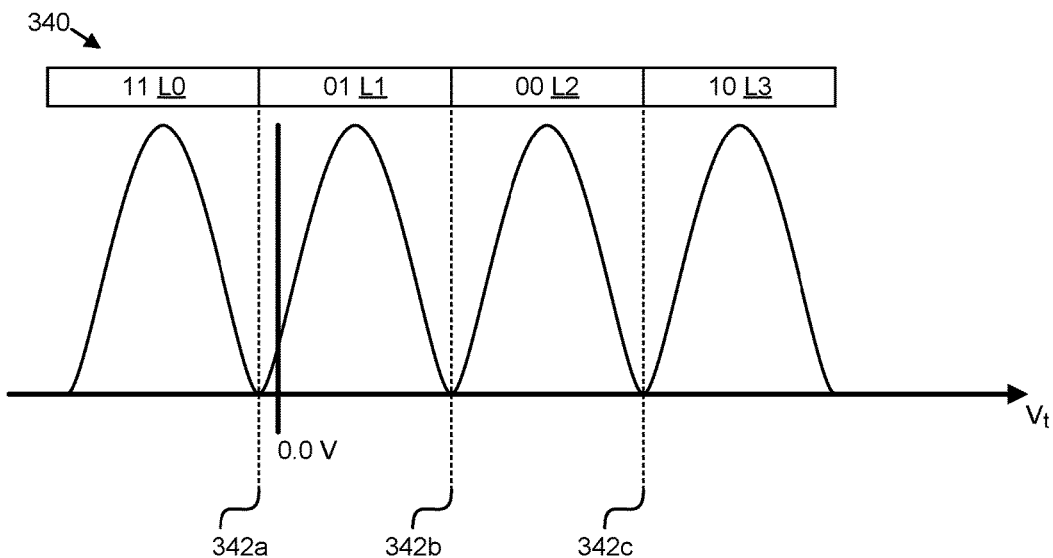
FIG. 3C is a graph illustrating a further embodiment of a distribution of threshold voltages for cells of a non-volatile memory element.

In FIG. 3C, the graph 340 depicts the same distribution of threshold voltages $V_t$ as the graph 320 of FIG. 3B, but with read thresholds 342 at different voltages than the read thresholds 322 of FIG. 3B. In one embodiment, a dynamic read component 150 may dynamically modify a read operation by changing one or more of the read thresholds 342. For example, if the dynamic read component 150 detects (based on read threshold 322a in FIG. 3B) that the number of cells in state L0 exceeds a threshold, it may modify the read operation to use new read thresholds (such as 342a, 342b 342c in FIG. 3C) shifted to lower voltages to compensate for threshold voltages $V_t$ for the cells drifting in a negative direction.

Figure 3D:
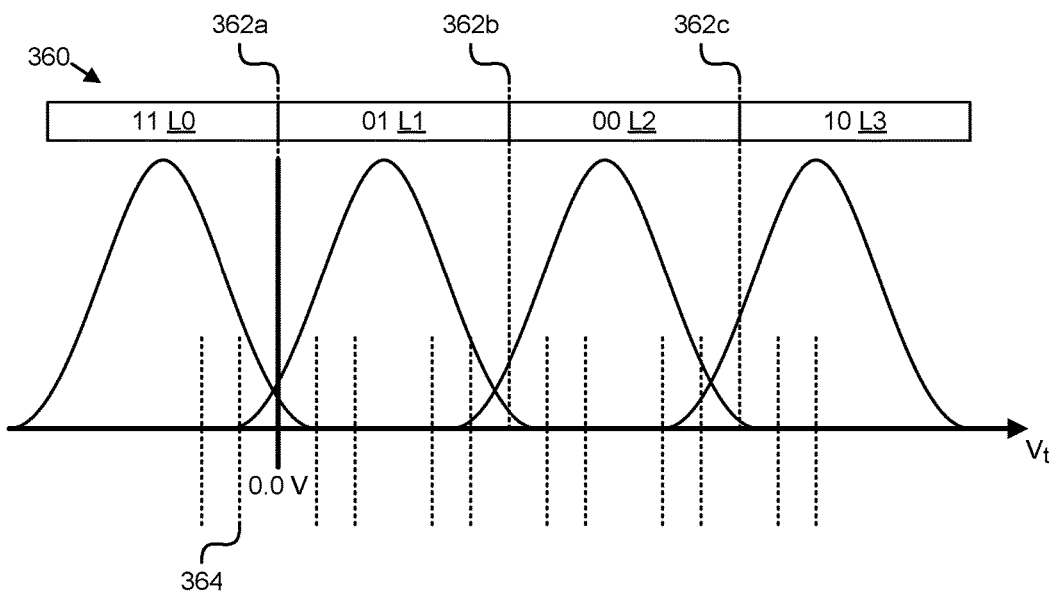
FIG. 3D is a graph illustrating another embodiment of a distribution of threshold voltages for cells of a non-volatile memory element.

In FIG. 3D, the graph 360 depicts a distribution of threshold voltages $V_t$ for the same cells as FIG. 3A, at a later time. The read thresholds 362 that define the boundaries between states L0-L3 are depicted at the same voltages as the read thresholds in FIG. 3A. However, the peaks in graph 360 have both drifted in the negative voltage direction (as in FIG. 3B), and widened over time due to the threshold voltage $V_t$ drifting for individual cells. As in FIG. 3B, a cell that has drifted past one of the read thresholds 362 may have drifted into an adjacent state. For example, a cell originally in the L0 state after data was written may now be sensed in the L1 stat due to the peaks widening. (The distribution is depicted as a set of overlapping peaks to emphasize the possibility that a cell programmed to one state may drift into an adjacent state; an actual distribution may be the sum of the individual peaks).

In certain embodiments, a dynamic read component 150 may dynamically modify a read operation by obtaining soft bits indicating a reliability of the data. For example, FIG. 3D depicts the read thresholds 362 that define the boundaries between states L0-L3, and additional read voltages 364 near the read thresholds. Sensing whether a threshold voltage $V_t$ for a cell is above or below one of the read thresholds 362 may determine a state for the cell, and sensing whether a threshold voltage $V_t$ for a cell is above or below one or more of the additional read voltages 364 may determine a likelihood that the cell was originally programmed to (or left erased in) it's current state.

For example, sensing that a threshold voltage $V_t$ for a cell is below the read threshold 362a that divides the L0 and L1 states may indicate that the cell is in the L0 state, and stores the data value "11." However, the cell may have drifted from the L1 state, storing the data value "01." The second bit (storing a 1) may therefore be reliable, since it is unlikely that the cell drifted from the L2 or L3 states. In a further embodiment, sensing whether the threshold voltage $V_t$ for a cell is above or below one or more additional read voltages 364 near the read threshold 362a may indicate a reliability for the first bit (which stores a 1 in the L0 state, but which stores a 0 in the L1 state, from which the cell may have drifted). For example, if the threshold voltage $V_t$ is well below the read threshold 362a, then the cell was likely originally in the L0 state when data was written. However, if the threshold voltage $V_t$ is below the read threshold 362a, but above a nearby additional read voltage 364, then it still may have been originally in the L0 state when data was written, but also is more likely to have been originally programmed to the L1 state. A "soft bit" may indicate a reliability of a data value based on the additional read voltages 364 in a variety of ways, and may be a likelihood that a bit is correct, a likelihood that a bit is incorrect, a log-likelihood ratio, or the like.

Figure 4:
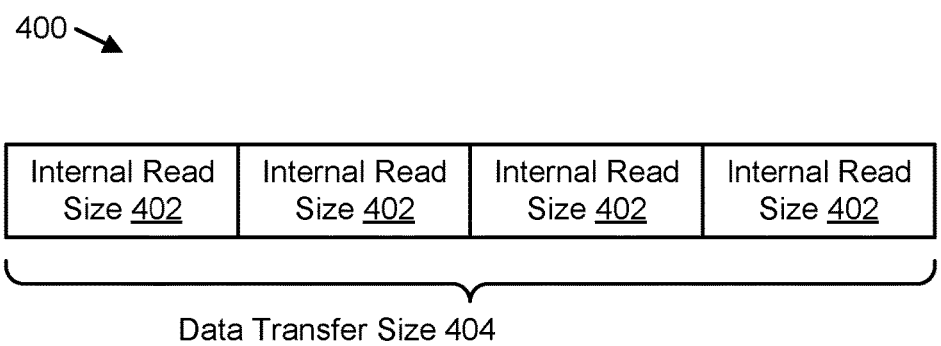
FIG. 4 is a schematic block diagram illustrating one embodiment of an internal read size in relation to a data transfer size.

FIG. 4 is a schematic block diagram 400 illustrating one embodiment of an internal read size 402 in relation to a data transfer size 404. In certain embodiments, a read command sent to a non-volatile memory element 123 may be for a chunk, block, page, or other unit of data, at a data transfer size 404 expected or requested by a device controller 126 external to the non-volatile memory element 123 or die. In various embodiments, a data transfer size 404 may refer to an amount of data read from a non-volatile memory element 123 and transferred to a device controller 126 in response to a single read command. Within a non-volatile memory element 123, however, the read command may be internally serviced by performing a plurality of read operations at a smaller internal read size 403. An internal read size 402, or a data size for a read operation, may refer to an amount of data that is read internally as a single unit. For example, in flash memory, word lines may be coupled to control gates across rows of cells, so that data is read from a set of cells coupled to the same word line in a single read operation.

In certain embodiments, as depicted in FIG. 4, the data size for a read operation (e.g., internal read size 402) is smaller than a data transfer size 404 between a non-volatile memory element 123 and a device controller 126. For example, a 4 KiB page to be transferred to the device controller 126 may be assembled from the data of four smaller 1 KiB internal reads. Various other ratios between an internal read size 402 and a data transfer size 404 may exist for other non-volatile memory elements 123 and device controllers 126. In certain embodiments, a dynamic read component 150 may be disposed on a die for a non-volatile memory element, and may monitor read statistics and dynamically modify read operations for internal read operations, at the smaller internal read size 402. In further embodiments, monitoring read statistics and dynamically modifying read operations on-die (e.g., during read operations at the internal read size 402) may allow a dynamic read component 150 to more accurately detect and indicate where errors are located, stop additional internal read operations early if an error rate is high, or the like.

Figure 5:
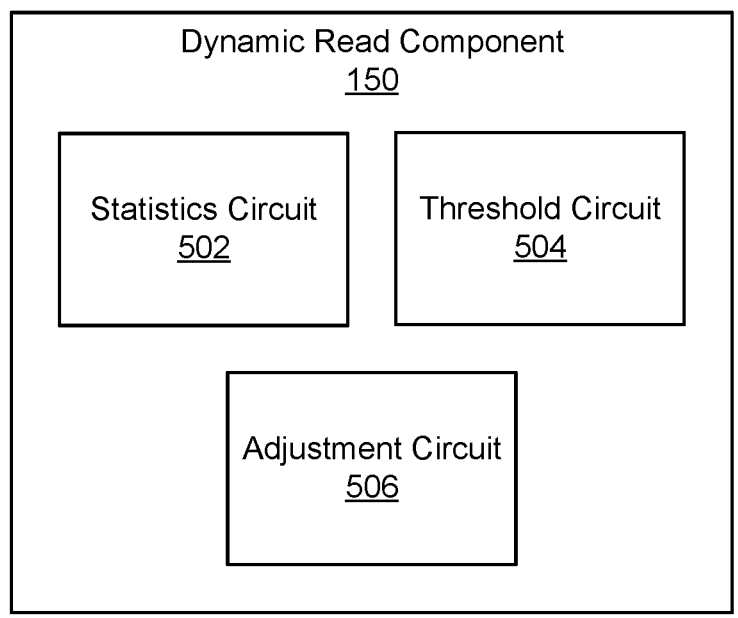
FIG. 5 is a schematic block diagram illustrating one embodiment of a dynamic read component.

FIG. 5 depicts one embodiment of a dynamic read component 150. The dynamic read component 150 may be substantially similar to the dynamic read component 150 described above with regard to FIG. 1 and FIG. 2. In general, as described above, the dynamic read component 150 is configured to dynamically modify, adjust, or update a read operation based on one or more read statistics. In the depicted embodiment, the dynamic read component 150 includes a statistics circuit 502, a threshold circuit 504, and an adjustment circuit 506.

In a certain embodiment, an on-die controller for a non-volatile memory die, such as the on-die controller 220 of FIG. 2, may include the statistics circuit 502, the threshold circuit 504, and the adjustment circuit 506. In certain embodiments, a die may be a semiconductor device of non-volatile memory. In various embodiments, a die may refer to an integrated circuit that includes both a core array of non-volatile memory cells and peripheral components for communicating with the core. In one embodiment, such an integrated circuit may be a three-dimensional integrated circuit that includes multiple die planes and/or layers, but may still be referred to as a die. As described with regard to FIGS. 1-2, a non-volatile memory device 120 may include one or more non-volatile memory elements 123 or dies.

In various embodiments, an on-die controller 220 may refer to a component on a die, control/operation logic on a die, a set of components on a die, or the like, that controls data operations for a memory array 200 on the die. In certain embodiments, an on-die controller 220 comprising a statistics circuit 502, a threshold circuit 504, and an adjustment circuit 506 may conserve resources of a device controller 126 external to a die, such as decoder time and power, by dynamically modifying, adjusting, or updating a read operation at the die level (and possibly during the read operation). By contrast, a device controller 126 external to a die may modify a second read operation after receiving data of a first read operation, but waiting for the first read operation to complete and for the data to be transferred consumes more time and transfers more data over a bus 127 than dynamically modifying a read operation at the die level.

The statistics circuit 502, in one embodiment, is configured to monitor one or more read statistics during a read operation for data of a non-volatile memory die. In various embodiments, a read operation may refer to any operation or process that reads, senses, or retrieves data from a non-volatile memory die. In certain embodiments, the dynamic read component 150 or on-die controller 220 may initiate a read operation in response to a read command from a device controller 126. In another embodiment, the dynamic read component 150 or on-die controller 220 may initiate a read operation as part of a grooming or garbage collection operation, or the like. In one embodiment, data may be read from a group of storage cells (such as cells coupled to a word line) together, and data for a read operation may have a fixed size, such as the internal read size 402 of FIG. 4. In another embodiment, (e.g., for a type of non-volatile medium other than flash memory), a read operation for a non-volatile die may be for a variable amount of data. In one embodiment, a "read operation" may refer to a single internal read. In another embodiment, a read operation may refer to a series of internal reads that retrieve a larger unit of data for transferring data to the device controller 126.

A "read statistic" as used herein, may refer to any information about the read operation that may be collected, monitored, tracked, or calculated by the statistics circuit 502. Various types of read statistics for read operations may pertain to the read operation at various levels of abstraction, from the physical data-encoding property of a storage cell (e.g., a threshold voltage $V_t$ for flash memory), to states (e.g., subranges of the data-encoding property defined by read thresholds), to bits that correspond to the states, or the like. For example, in one embodiment, ramp word line sensing may include determining threshold voltages $V_t$ for a set of storage cells before converting the voltages to states or bits, and a voltage statistic may include any statistic relating to the voltages, such as an average voltage, a standard deviation for the voltages, a count of voltages less than a first read threshold, a ratio of voltages less than a first read threshold to voltages greater than a first read threshold or the like.

As a further example, a read statistic may be a balance between or among states, a balance between zeros and ones, or the like. As used herein, a "balance" may refer to any measurement or indicator that measures or relates to a ratio between zeros and ones, a ratio of cells in different states, or the like. For example, a "balance" between zeros and ones may refer to a proportion of zeros in the data of a read operation, a proportion of ones in the data of a read operation, a ratio of ones to zeros, a ratio of zeros to ones, a count of ones, a count of zeros, a difference between a count of ones and a count of zeroes, an average data value (between one and zero) or the like. Similarly, a "balance" between or among states may refer to a count or proportion of cells in any one of the states, a ratio of cells in one state to cells in another state, or the like. In certain embodiments, the statistics circuit 502 may track or monitor one or more read statistics, of one or more different types, such as a balance of zeros and ones and a balance of states. Various further types of read statistics will be clear in view of this disclosure.

In certain embodiment, data of a non-volatile memory element 123 or die may be written or stored subject to a data transformation that balances bit values (e.g., ones and zeros) for the data. A transformation may refer to any function, mapping, encoding, or the like that is applied to store the data. For example, a data transformation may include applying an error correcting code, encrypting the data, compressing the data, scrambling or whitening the data, or the like. In certain embodiments, data transformations may balance bit values. A transformation that balances bit values may refer to any transformation that produces an approximately equal number of zeros and ones in the transformed data. For example, a block of zeros may be transformed to a sequence of ones and zeros. In one embodiment, transforming one block or chunk of data with a transformation that balances bit values may produce a block or chunk of transformed data in which the number of ones and zeros are not exactly equal, however, the transformation may produce an equal number of ones and zeros on average. Similarly, a variance and/or standard deviation for the number of ones or zeros produced by a data transformation may be known. In another embodiment, a data transformation may encode bits to states in a way that balances the states (e.g., so that the L0, L1, L2, and L3 states occur equally often).

In a certain embodiment, a data transformation may balance bit values, or may produce a predetermined or known balance of bit values. For example, one data transformation may produce a proportion of 50% zeros in the transformed data. Another transformation may be known to produce a proportion of 40% zeros in the transformed data.

Similarly, a transformation may balance states (e.g., 25% of cells in each of four states) or may produce a known balance of states. In various embodiments, where data is written, stored, or programmed with a known balance between ones and zeros, a known balance among states or the like, or another known characteristic of a data transformation, a read statistic monitored by the statistics circuit 502 may include the balance or characteristic that is known for the data transformation. In a further embodiment, comparing the actual balance or characteristic obtained during a read operation to a known or expected balance or characteristic may indicate or suggest an error rate. Thus, using a statistics circuit 502 to monitor one or more read statistics may allow a dynamic read component 150 to modify, update, or adjust a read operation based on the one or more monitored read statistics.

In one embodiment, a read statistic monitored or tracked by a statistics circuit 502 comprises a balance between zeros and ones for at least a portion of the data of the read operation. In a certain embodiment, the statistics circuit 502 may track an ongoing balance between bit values for the data during the read operation. In various embodiments, the statistics circuit 502 may track one or more statistics on an ongoing basis, or for a portion of data of a read operation, in various ways. For example, a statistics circuit 502 may include a register, accumulator, or the like, used to store or count the number of ones (or the number of zeros) in the data as the data is read. In certain embodiments, a read operation may include a number of sub-operations. For example, referring to FIG. 3A, a read-operation for MLC flash memory may first include reading the second bit depicted in FIG. 3A (1 for the L0 and L1 states, 0 for the L2 and L3 states), by detecting whether threshold voltages $V_t$ for a group of cells are above or below the central read threshold 302b. The read operation may then include sensing the first bit using read thresholds 302a and 302c. Thus, a balance of zeros and ones may be determined for a portion of the data (e.g., the second bit) on an ongoing basis, before both bits are obtained. Similarly, in another embodiment, a read operation may include sensing whether threshold voltages $V_t$ for a group of cells are above or below the read thresholds 302a, 302b, 302c in order, and the number or proportion of cells in the L0 state may be obtained before the number or proportion of cells in the other states. Thus, tracking an ongoing balance between or among states may include obtaining a count or proportion of cells in one of the states before the number or proportion of cells in another state is obtained.

In various embodiments, the statistics circuit 502 may obtain or calculate numeric information to monitor or track a read statistic. For example, in one embodiment, monitoring a read statistic may include obtaining a count of ones, a count of zeros or the like. In another embodiment, monitoring a read statistic may include calculating a difference between counts of ones and zeroes, a ratio between counts of ones and zeros or the like. Various ways to monitor a read statistic by obtaining or calculating numeric information will be clear in view of this disclosure.

The threshold circuit 504, in one embodiment, is configured to determine whether the one or more read statistics monitored by the statistics circuit 502 satisfy a threshold for the read operation. For example, in one embodiment, the threshold circuit 504 may compare the one or more read statistics to one or more expected statistics for the data.

In general, in various embodiments, the on-die controller 220 or dynamic read component 150 may proceed normally with a read operation if the read statistic(s) are normal, within an expected or acceptable range, or the like, and may modify, adjust or update a read operation if one or more of the read statistics are outside of acceptable ranges. A "threshold" for a read statistic, in various embodiments, may be a value or set of values to which the read statistic is compared, to determine whether the read statistic is within an expected, allowed, or acceptable range. For example, in one embodiment a threshold may be a maximum allowed value for a read statistic. In another embodiment, a threshold may be a minimum acceptable value for a read statistic. In a further embodiment, a threshold may be a pair of maximum and minimum values establishing an acceptable range for a read statistic. Various further types of thresholds for read statistics will be clear in view of this disclosure. A read statistic is said to satisfy the threshold if the read statistic is acceptable in comparison to the threshold (e.g., is below a maximum, above a minimum, within a range, or the like), and fails to satisfy the threshold otherwise.

In certain embodiments, a threshold for a plurality of read statistics may include a set of thresholds for individual read statistics, so that the plurality of read statistics fails to satisfy the threshold if any of the individual read statistics fails to satisfy a corresponding individual threshold. In various embodiments, the threshold circuit 504 may determine whether one or more read statistics satisfies a threshold by comparing the one or more read statistics to a threshold. In one embodiment, a threshold circuit 504 may include logic hardware for comparing a statistic to a threshold, as well as memory, a register, or the like for storing a threshold, a statistic, and/or a result, and the like.

In a certain embodiment, a threshold circuit 504 may compare one or more read statistics to one or more expected read statistics. In various embodiments, an expected read statistic may refer to a known or inferred statistic relating to the data when it was written. For example, in one embodiment, an expected read statistic may be inferred from a known property or characteristic of a data transformation applied to the data before storing the data. As a further example, an expected statistic for a data transformation that balances bit values may be 50% zeroes, 512 zeroes for a 1024 bit unit of data, 500-524 zeros for a 1024 bit unit of data (where a standard deviation for the number of zeros produced by the data transformation is known), or the like. In another example, an expected statistic may be a measured statistic from when the data was written. For example, in one embodiment, an actual balance of ones and zeroes may be measured when the data is written, and stored with other metadata for the data.

In one embodiment, as described above, a threshold used by the threshold circuit 504 may be based on a balance between ones and zeros for data written with a known balance between ones and zeros. In another embodiment, a threshold used by the threshold circuit 504 may be based on a balance among states for storage cells programmed with a known balance of states. For example, where data is programmed subject to a transformation that results in the states L0-L3 occurring equally often, a threshold may be based on an expected 25% of cells in the L0 state. In a further embodiment, a threshold used by the threshold circuit 504 may be based on a voltage statistic for the read operation. For example, a threshold may be based on a count, average, grouping or the like of voltages, prior to converting the voltages to states or bits. In one embodiment, a threshold for a plurality of read statistics may be based on one or more of a balance between ones and zeros, a balance among states, and/or a voltage statistic. In various embodiments, using a threshold circuit 504 to compare actual read statistics to expected read statistics may allow the dynamic read component 150 to determine when to update or modify a read operation.

The adjustment circuit 506, in one embodiment, is configured to dynamically modify the read operation based on the threshold circuit 504 determining that the one or more read statistics monitored by the statistics circuit 502 fail to satisfy a threshold. example, the adjustment circuit 506 may adjust a read operation based on a tracked ongoing balance between bit values, or may update a read operation based on a variance between the one or more monitored read statistics and one or more expected read statistics for the data. A variance, in certain embodiments, may refer to any measure of divergence or discrepancy between monitored and expected read statistics.

In various embodiments, modifying, updating, or adjusting a read operation may refer to changing the read operation in any way. In certain embodiments, the adjustment circuit 506 may adjust a read operation by stopping or aborting the read operation, adjusting one or more read parameters for the read operation, or the like. Stopping the read operation and adjusting read operation parameters are described in further detail below with reference to the abort circuit 602 and the change circuit 604 of FIG. 6.

In various embodiments, an adjustment, modification, or update to a read operation may be referred to as "dynamic" if it occurs during a set of one or more read operations performed on a non-volatile memory element 123 or die, without the modification being specifically requested by a device controller 126 or driver external to the non-volatile memory element 123 or die. For example, a dynamic modification may be made by the adjustment circuit 506 during or within a read operation. In addition, or alternatively, a read operation may include multiple sub-operations such as sense operations at different read thresholds, internal reads of small units of data, or the like, and a dynamic modification may occur after one or more of the sub-operations but may affect other sub-operations. By contrast, a non-dynamic modification to read parameters may be made by a device controller 126 or driver external to a non-volatile memory element 123 or die, after receiving data of a first read operation. In various embodiments, using an on-die adjustment circuit 506 to dynamically adjust a read operation may allow prompt adjustments to be made, avoiding a round-trip of data out to a device controller 126 and modifications back from a device controller 126.

In various embodiments, using an adjustment circuit 506 to dynamically adjust a read operation may improve one or more read statistics for the data. For example, referring to FIG. 3B and FIG. 3C, dynamically adjusting a read operation to change read thresholds from the read thresholds 322 of FIG. 3B to the read thresholds 342 of FIG. 3C may improve a read statistic such as a balance between ones and zeros, a balance among states, or the like. In a further embodiment, dynamically adjusting a read operation may improve an error rate for the data. In various embodiments, using an adjustment circuit 506 to dynamically modify a read operation based on read statistics may improve error rates, conserve decoder time and power, reduce usage of a shared bus, or the like. In a further embodiment, multiple adjustment circuits 506 on different non-volatile memory elements 123 or die may operate in parallel, providing speed advantages over a device controller 126 external to a die non-dynamically modifying read parameters for one die at a time.

Figure 6:
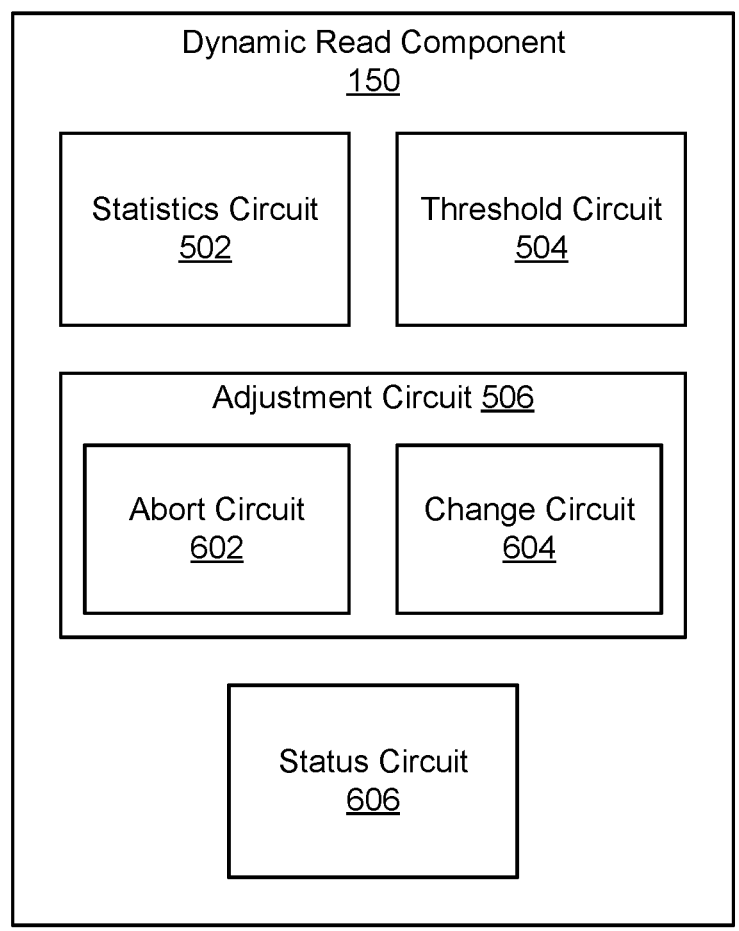
FIG. 6 is a schematic block diagram illustrating another embodiment of a dynamic read component.

FIG. 6 depicts another embodiment of a dynamic read component 150. The dynamic read component 150, in certain embodiments, may be substantially similar to the dynamic read component 150 described above with regard to FIG. 1, FIG. 2, and/or FIG. 5. In the depicted embodiment, the dynamic read component 150 includes a statistics circuit 502, a threshold circuit 504, and an adjustment circuit 506, which may be configured substantially as described above with regard to FIG. 5. The adjustment circuit 506, in the depicted embodiment, includes an abort circuit 602 and a change circuit 604. The dynamic read component 150, in the depicted embodiment, includes a status circuit 606.

In one embodiment, dynamically modifying a read operation may include stopping the read operation without transferring the data of the read operation from the non-volatile memory die to a device controller 126. In a certain embodiment, the adjustment circuit 506 uses the abort circuit 602 to stop a read operation without transferring data to a device controller 126. In certain embodiments, dynamically stopping a read operation may avoid wasting time on completing a read operation for uncorrectable data. For example, in one embodiment, data may be written subject to a transformation that results in a balanced number of states (e.g., approximately 25% of the cells in a group of cells will be in any state). If sensing at a first read threshold reveals that a very large or very small number of cells are in the first state, then the data may have a larger number of errors than a decoder can correct, and using an abort circuit 602 to stop the read operation may save time that would be spent on sensing at further read thresholds, as well as time and power to transmit and attempt to decode the data. Similarly, in another embodiment, a read operation may include a hard read that determines bit values, and a soft read (e.g., using the additional read voltages 364 of FIG. 3C) that indicates a likelihood that the hard bit values are correct. If a ratio of ones and zeros is very large or very small for the hard bit values, then the data may have a larger number of errors than a decoder can correct, and using an abort circuit 602 to stop the read operation may save time that would be spent on the soft read, as well as time and power to transmit and attempt to decode the data.

In a further embodiment, the adjustment circuit 506 may use the abort circuit 602 to stop one or more additional read operations subsequent to the aborted read operation. For example, as depicted in FIG. 4, a read command from a device controller 126 (for data of a transfer size 404) may correspond to a plurality of internal read operations at a smaller internal read size 402. The abort circuit 602 may stop one of the internal read operations, and subsequent internal read operations for servicing the read command. In certain embodiments, using an abort circuit 602 to stop a series of read operations may avoid further attempts to read from a highly erroneous or defective region of non-volatile storage.

In another embodiment dynamically modifying a read operation may include changing one or more read parameters during the read operation, prior to transferring the data to a device controller 126 external to a die. In a certain embodiment, the adjustment circuit 506 uses the change circuit 604 to change one or more read parameters. Although the disclosed embodiments of dynamically modifying a read operation are primarily discussed as occurring prior to transferring data to a device controller 126 (e.g., occurring substantially autonomously within an integrated circuit die), in other embodiments, the adjustment circuit 506 may be configured to change one or more read parameters after a read operation, after transferring data to the device controller 126, or the like, and may use the changed and/or adjusted one or more read parameters in a subsequent read operation.

A read parameter, as used herein, may refer to any value or factor for controlling a read operation. In various embodiments, a parameter for a read operation may be a default parameter, a parameter sent with a read command, a parameter set in a register or memory for a non-volatile memory element 123 or die, or the like. In various embodiments, read parameters may include values of read thresholds (e.g., read thresholds 302 in FIG. 3A), a bit for controlling whether a read operation includes a soft read for determining reliability of data values, or the like.

In one embodiment, the change circuit 604 may change a read parameter by changing one or more read thresholds. For example, if the threshold circuit 504 determines that a monitored balance between zeros and ones, or among states, violates a threshold, the change circuit 604 may change one or more of the read thresholds that define the boundaries between states, thus adjusting the monitored balance. In one embodiment, the threshold circuit 504 may determine that a read statistic violates a threshold after sensing at one of the read thresholds, and the change circuit 604 may change the other read thresholds, for at least the rest of the read operation. In another embodiment, the change circuit 604 may change the read thresholds and restart the read operation to use the changed read thresholds.

In a certain embodiment, the change circuit 604 may change a read parameter by changing whether the read operation includes obtaining soft bits indicating a data reliability. For example, if a monitored balance between ones and zeros violates a threshold, errors may be likely, but a decoder may be more likely to successfully decode the data if a change circuit 604 changes read parameters to obtain soft bits. In one embodiment, the change circuit 604 may temporarily change one or more read parameters for the current read operation (e.g., for the remainder of the read operation, or if the read operation is restarted). In a further embodiment, the change circuit 604 may change one or more read parameters so that the read parameters remain changed for one or more subsequent read operations.

In some embodiments, the threshold circuit 504 may compare a read statistic to multiple thresholds, and the adjustment circuit 506 may use the abort circuit 602 to stop a read operation or the change circuit 604 to change one or more read parameters depending on which thresholds the read statistic satisfies, or fails to satisfy. For example, in one embodiment, a read statistic may fail to satisfy a first threshold, indicating that the read statistic is out of an expected range, but may satisfy a second threshold, indicating that changing read parameters may make the data correctable (e.g., an error rate is likely to be within a rate that an ECC decoder can correct). In a further embodiment, the adjustment circuit 506 may dynamically modify the read operation using the change circuit 604 based on the read statistic satisfying the second threshold. In another embodiment, however, a read statistic may fail to satisfy both thresholds, indicating that the data is not likely to be correctable even with changed parameters, and the adjustment circuit 506 may use the abort circuit 602 to stop the read operation dynamically (e.g., during or within the read operation).

In various embodiments, an abort circuit 602 stopping a read operation without transferring data to a device controller 126 external to a die, or a change circuit 604 changing read parameters prior to transferring data to a device controller 126 external to a die, may conserve decoder time and power by fixing read data (or determining that the data is uncorrectable) before the data gets to a decoder. Additionally, an abort circuit 602 stopping a read operation without transferring data to a device controller 126, or a change circuit 604 changing read parameters prior to transferring data to a device controller 126 may conserve resources of a shared bus.

The status circuit 606, in one embodiment, is configured to communicate a status for the read operation to a device controller 126. In various embodiments, a status for a read operation may include any information about the state or condition of the read operation or of the data. In various embodiments, the status circuit 606 may communicate a status by sending status information with the read data, sending status information before or after the read data, sending status information in place of the read data (e.g., for an aborted read operation), sending status information separately from the read data, making status information available in a location the device controller 126 can read, or the like.

In a certain embodiment, a status communicated by the status circuit 606 may include an indication that a read operation has been stopped, an error location, and/or an indication that one or more read parameters have been changed. For example, in one embodiment, the abort circuit 602 may stop a read operation, and the status circuit 606 may communicate that the read operation has been stopped. In a further embodiment, the status circuit 606 may send an uncorrectable ECC (UECC) error code to the device controller 126. In a certain embodiment, the status circuit 606 may further indicate the location where an error has occurred. In one embodiment, where internal read operations are smaller than a data transfer size (e.g., as depicted in FIG. 4) a status circuit 606 may indicate where an error has occurred at the same granularity as the internal read operations. By contrast, a device controller 126 may only be able to determine where errors are located at the same granularity as the transfer size. In a further embodiment, the change circuit 604 may change one or more read parameters, and the status circuit 606 may communicate that the parameters have changed by sending the new parameters to the device controller 126, sending an indication that the parameters have changed, making the new parameters available for the device controller 126 to poll, or the like.

In one embodiment, the status circuit 606 may be configured to communicate a status in response to a check status command from the device controller 126. For example, a "check status" command that returns a "ready" status when data of a read operation is ready to be transferred to the device controller 126, and a "busy" status when the operation is ongoing, may be extended to return a "modified" status when a read operation has been dynamically modified based on one or more read statistics. In a further embodiment, a "modified" status may include additional fields for information about how the read operation was modified.

In another embodiment, the status circuit 606 may be configured to initiate a signal for communicating the status without being polled by the device controller 126. For example, if the abort circuit 602 aborts a read operation the status circuit 606 may send a "stopped" status without waiting to be polled by the device controller 126. In another embodiment, if the change circuit 604 changes one or more read parameters, the status circuit 606 may initiate a signal informing the device controller 126 of a latency change for the modified operation, so that the device controller 126 waits a further latency time to allow the modified read operation to complete before attempting to retrieve the data.

In a certain embodiment, the status circuit 606 is configured to communicate the status in response to a data transfer command from the device controller 126. For example, in one embodiment, a data transfer interface may be extended so that a command to transfer the data returns the data if a read operation completed normally, returns the data plus status information if the change circuit 604 changed one or more read parameters, and returns status information without data if the read operation was aborted by the abort circuit 602. Various further types of statuses and ways of communicating a status will be clear in view of this disclosure.

Figure 7:
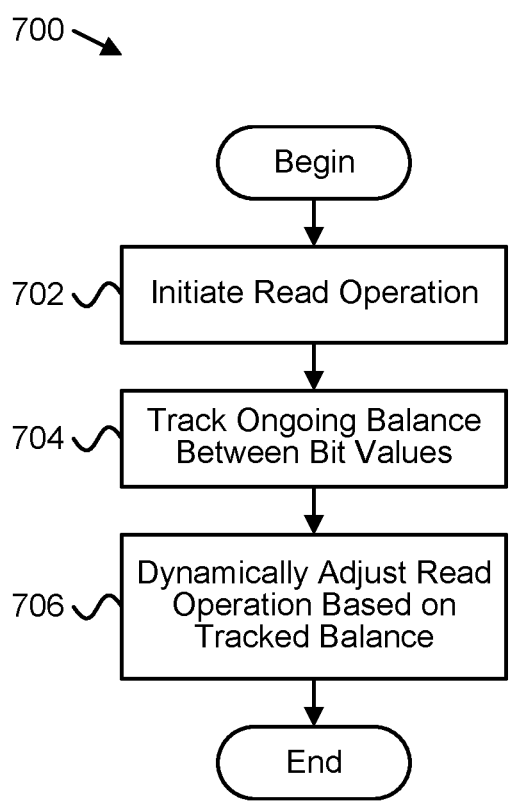
FIG. 7 is a schematic flow chart diagram illustrating one embodiment of a method for a dynamic read operation based on read statistics.
Figure 8:
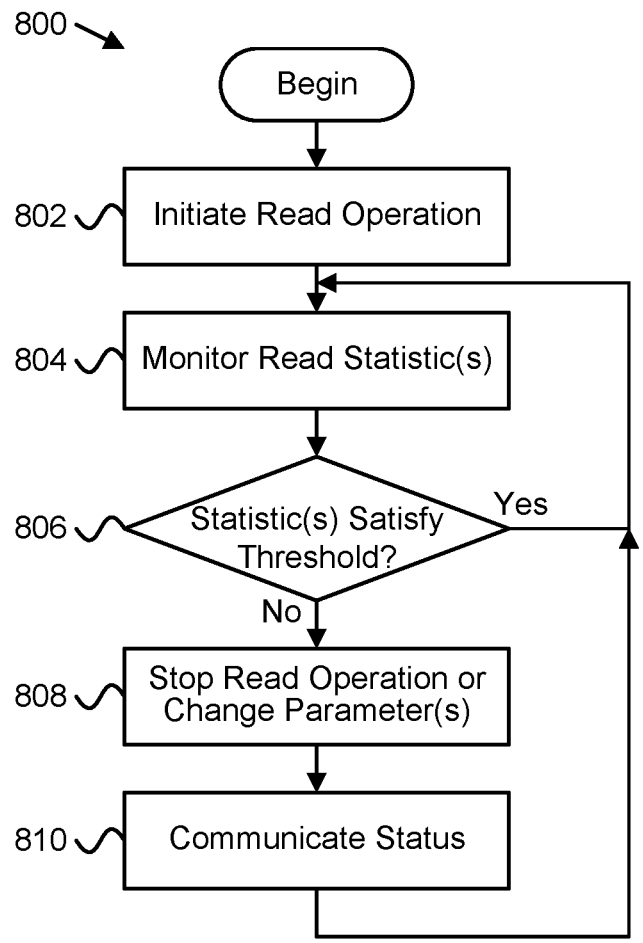
FIG. 8 is a schematic flow chart diagram illustrating a further embodiment of a method for a dynamic read operation based on read statistics.

FIG. 7 is a schematic flow chart diagram illustrating one embodiment of a method 700 for a dynamic read operation based on read statistics. The method 700 begins, and a dynamic read component 150 initiates 702 a read operation for data of a non-volatile memory element 123. In certain embodiments, the data is stored subject to a data transformation that balances bit values for the data. A statistics circuit 502 tracks 704 an ongoing balance between bit values for the data during the read operation. An adjustment circuit 506 dynamically adjusts 706 the read operation based on the tracked ongoing balance, and the method 700 ends FIG. 8 is a schematic flow chart diagram illustrating a further embodiment of a method 800 for a dynamic read operation based on read statistics. The method 800 begins, and a dynamic read component 150 initiates 802 a read operation for data of a non-volatile memory element 123. A statistics circuit 502 monitors 804 one or more read statistics. A threshold circuit 504 determines 806 whether the one or more read statistics satisfy a threshold. If the one or more read statistics satisfy the threshold, the statistics circuit 502 continues to monitor 804 one or more read statistics, and the method 800 continues during the remainder of the read operation. If the one or more read statistics fail to satisfy the threshold, an adjustment circuit 506 stops or changes 808 the read operation. A status circuit 606 communicates 810 the status of the read operation to a device controller 156. If the read operation was changed rather than stopped, the statistics circuit 502 continues to monitor 804 one or more read statistics, and the method 800 continues during the remainder of the read operation.

A means for monitoring one or more read statistics, in various embodiments, may include a statistics circuit 502, a dynamic read component 150, sense blocks, read/write circuits, an on-die controller, a state machine, registers or memory, logic hardware for calculating the statistics, other logic hardware, and/or other executable code stored on a computer readable storage medium. Other embodiments may include similar or equivalent means for monitoring read statistics.

A means for comparing one or more read statistics to one or more expected read statistics, in various embodiments, may include a threshold circuit 504, a dynamic read component 150, an on-die controller, a state machine, registers or memory, logic hardware for comparing the statistics, other logic hardware, and/or other executable code stored on a computer readable storage medium. Other embodiments may include similar or equivalent means for comparing read statistics to expected read statistics.

A means for dynamically updating a read operation, in various embodiments, may include an adjustment circuit 506, an abort circuit 602, a change circuit 604, a dynamic read component 150, an on-die controller, a state machine, registers or memory, other logic hardware, and/or other executable code stored on a computer readable storage medium. Other embodiments may include similar or equivalent means for dynamically updating a read operation.

A means for communicating a status for a read operation to a device controller, in various embodiments, may include a status circuit 606, a dynamic read component 150, an on-die controller, a state machine, registers or memory, a bus, other logic hardware, and/or other executable code stored on a computer readable storage medium. Other embodiments may include similar or equivalent means for communicating a status.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    an on-die controller for a non-volatile memory die, the on-die controller comprising:
        a statistics circuit that monitors one or more read statistics during a read operation for data of the non-volatile memory die;
        a threshold circuit that determines whether the one or more read statistics satisfy a threshold for the read operation; and
        an adjustment circuit that dynamically modifies the read operation on-die based on determining that the one or more read statistics fail to satisfy the threshold without sending the data to a device controller external to the non-volatile memory die prior to the adjustment circuit dynamically modifying the read operation, wherein the on-die controller further comprises a status circuit that communicates a status for the read operation to the device controller, the status comprising one or more of an indication that the read operation has been stopped, an error location, and an indication that one or more read parameters have been changed.

2. The apparatus of claim 1, wherein the read statistic comprises a balance between zeros and ones for at least a portion of the data.

3. The apparatus of claim 1, wherein the adjustment circuit dynamically modifies the read operation by stopping the read operation without transferring the data from the non-volatile memory die to the device controller.

4. The apparatus of claim 3, wherein the adjustment circuit is further configured to stop one or more additional read operations subsequent to the read operation.

5. The apparatus of claim 1, wherein the adjustment circuit dynamically modifies the read operation by changing one or more read parameters during the read operation and restarting the read operation with the one or more changed read parameters, prior to transferring the data to the device controller.

6. The apparatus of claim 5, wherein changing one or more read parameters comprises one or more of:
    changing one or more read thresholds; and
    obtaining soft bits indicating a reliability of the data.

7. The apparatus of claim 1, wherein the status circuit is configured to communicate the status in response to a check status command from the device controller.

8. The apparatus of claim 1, wherein the status circuit is configured to initiate a signal for communicating the status without being polled by the device controller.

9. The apparatus of claim 1, wherein the status circuit is configured to communicate the status in response to a data transfer command from the device controller.

10. The apparatus of claim 1, wherein the threshold is based on one or more of a balance between ones and zeros for data written with a known balance between ones and zeros, a balance among states for storage cells programmed with a known balance of states, and a voltage statistic for the read operation.

11. The apparatus of claim 1, wherein a data size for the read operation is smaller than a data transfer size between the non-volatile memory die and the device controller.

12. A method comprising
initiating a read operation for data of a non-volatile memory element, the data stored subject to a data transformation that balances ones and zeros for the data;
tracking an ongoing balance between ones and zeroes for the data during the read operation;
dynamically adjusting the read operation on the non-volatile memory element based on the tracked ongoing balance without sending the data to a device controller external to the non-volatile memory element prior to the dynamically adjusting the read operation; and
communicating a status for the adjusted read operation from the non-volatile memory element to the device controller for the non-volatile memory element.

13. The method of claim 12, wherein dynamically adjusting the read operation comprises stopping the read operation without transferring the data to the device controller.

14. The method of claim 13, further comprising stopping one or more additional read operations subsequent to the read operation.

15. The method of claim 12, wherein dynamically adjusting the read operation comprises changing one or more read parameters during the read operation, prior to transferring the data to the device controller.

16. The method of claim 15, wherein changing one or more read parameters comprises one or more of:
changing one or more read thresholds; and
obtaining soft bits indicating a reliability of the data.

17. An apparatus comprising:
means for monitoring one or more read statistics during a read operation for data of a non-volatile memory die;
means for comparing the one or more read statistics to one or more expected statistics for the data, the one or more expected statistics corresponding to one or more known characteristics of a data transformation used to store the data;
means for dynamically updating the read operation on-die based on a variance between the one or more read statistics and the expected statistics for the data by changing one or more read thresholds and one of restarting and continuing the read operation with the changed read thresholds, without sending the data to a device controller external to the non-volatile memory die prior to the dynamically updating the read operation; and
means for communicating a status for the read operation to the device controller.

* * * * *